(12) United States Patent
Hasegawa et al.

(10) Patent No.: US 9,530,913 B2
(45) Date of Patent: Dec. 27, 2016

(54) SOLAR CELL

(71) Applicant: Sanyo Electric Co., Ltd., Moriguchi, Osaka (JP)

(72) Inventors: Isao Hasegawa, Akashi (JP); Toshio Asaumi, Kishiwada (JP); Hitoshi Sakata, Higashi-Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/033,683

(22) Filed: Sep. 23, 2013

(65) Prior Publication Data

US 2014/0020740 A1 Jan. 23, 2014

Related U.S. Application Data

(63) Continuation of application No. PCT/JP2012/056099, filed on Mar. 9, 2012.

(30) Foreign Application Priority Data

Mar. 25, 2011 (JP) ................................. 2011-067441

(51) Int. Cl.
*H01L 31/0352* (2006.01)
*H01L 31/0224* (2006.01)
(Continued)

(52) U.S. Cl.
CPC ............... *H01L 31/035281* (2013.01); *H01L 31/022441* (2013.01); *H01L 31/0682* (2013.01); *H01L 31/0747* (2013.01); *Y02E 10/547* (2013.01)

(58) Field of Classification Search
CPC .................... H01L 31/022441; H01L 31/0682; H01L 31/035281; H01L 31/0747
See application file for complete search history.

(56) References Cited

U.S. PATENT DOCUMENTS 7,199,395 B2  4/2007  Terakawa et al.
8,796,539 B2  8/2014  Asaumi et al.
(Continued)

FOREIGN PATENT DOCUMENTS

JP  2005-101240 A  4/2005
JP  2009-200267 A  9/2009
(Continued)

OTHER PUBLICATIONS

Granek, et al "Enhanced Lateral current transport via the front n+ diffused layer of n-type high-efficiency back-junction back-contact silicon solar cells," Progress in Photovoltaics Research and Applications, 2009, 47-56.*

(Continued)

*Primary Examiner* — Marla D McConnell

(57) ABSTRACT

Provided is a solar cell having improved photoelectric conversion efficiency. The solar cell (1) contains: a substrate (10) comprising a semiconductor material having one type of conductivity; a first semiconductor layer (12*n*) having the one type of conductivity; and a second semiconductor layer (17*n*) having the one type of conductivity. The first semiconductor layer (12*n*) is arranged on one main surface of the substrate (10). The second semiconductor layer (17*n*) is arranged on the other main surface of the substrate (10). The solar cell (1) is configured such that the strength of the electric field formed by the second semiconductor layer (17*n*) is greater than the strength of the electric field formed by the first semiconductor layer (12*n*).

12 Claims, 6 Drawing Sheets

(51) Int. Cl.
*H01L 31/068* (2012.01)
*H01L 31/0747* (2012.01)

(56) References Cited

U.S. PATENT DOCUMENTS

| | | | |
|---|---|---|---|
| 2001/0050404 A1* | 12/2001 | Saito et al. .................... | 257/461 |
| 2005/0062041 A1 | 3/2005 | Terakawa et al. | |
| 2010/0236613 A1* | 9/2010 | Lee et al. ....................... | 136/255 |
| 2010/0263722 A1 | 10/2010 | Kubo et al. | |
| 2011/0056545 A1* | 3/2011 | Ji ....................... | H01L 31/02167 |
| | | | 136/255 |
| 2011/0056550 A1* | 3/2011 | Choi et al. .................... | 136/256 |
| 2012/0012179 A1 | 1/2012 | Asaumi et al. | |

FOREIGN PATENT DOCUMENTS

| | | |
|---|---|---|
| JP | 2010-258043 A | 11/2010 |
| WO | 2010113750 A1 | 10/2010 |

OTHER PUBLICATIONS

Makoto Konagai et al., Taiyo Denchi no Kiso to Oyo, Jul. 20, 2010, pp. 98 to 101, Baifukan Co., Ltd., Tokyo, Japan.

* cited by examiner

SOLAR CELL

CROSS-REFERENCE TO RELATED APPLICATIONS

This is a continuation of International Application PCT/JP2012/056099, with an international filing date of Mar. 9, 2012, filed by applicant, the disclosure of which is hereby incorporated by reference in its entirety.

FIELD OF THE INVENTION

The present invention relates to a solar cell.

BACKGROUND

Back contact solar cells are conventionally known (for an example, see Patent Document 1). A back contact solar cell does not require an electrode on the light-receiving surface. As a result, the light-receiving efficiency of back contact solar cells can be increased. Therefore, further improvement in photoelectric conversion efficiency can be realized.

CITED DOCUMENTS

Patent Documents

Patent Document 1: Laid-Open Patent Publication No. 2009-200267

SUMMARY

Problem Solved by the Invention

There is demand for even better photoelectric conversion efficiency in back contact solar cells.

In view of this situation, it is an object of the present invention to provide a solar cell having improved photoelectric conversion efficiency.

Means of Solving the Problem

The solar cell of the present invention includes a substrate comprising a semiconductor material, a first semiconductor layer, and a second semiconductor layer. The substrate has one type of conductivity. The first semiconductor layer is arranged on one main surface of the substrate. The first semiconductor layer has the one type of conductivity. The second semiconductor layer is arranged on the other main surface of the substrate. The second semiconductor layer has the one type of conductivity. The solar cell of the present invention is configured such that the strength of the electric field formed by the second semiconductor layer is greater than the strength of the electric field formed by the first semiconductor layer.

Means of Solving the Problem

The present invention is able to provide a solar cell having improved photoelectric conversion efficiency.

DETAILED DESCRIPTION

Figure 1:
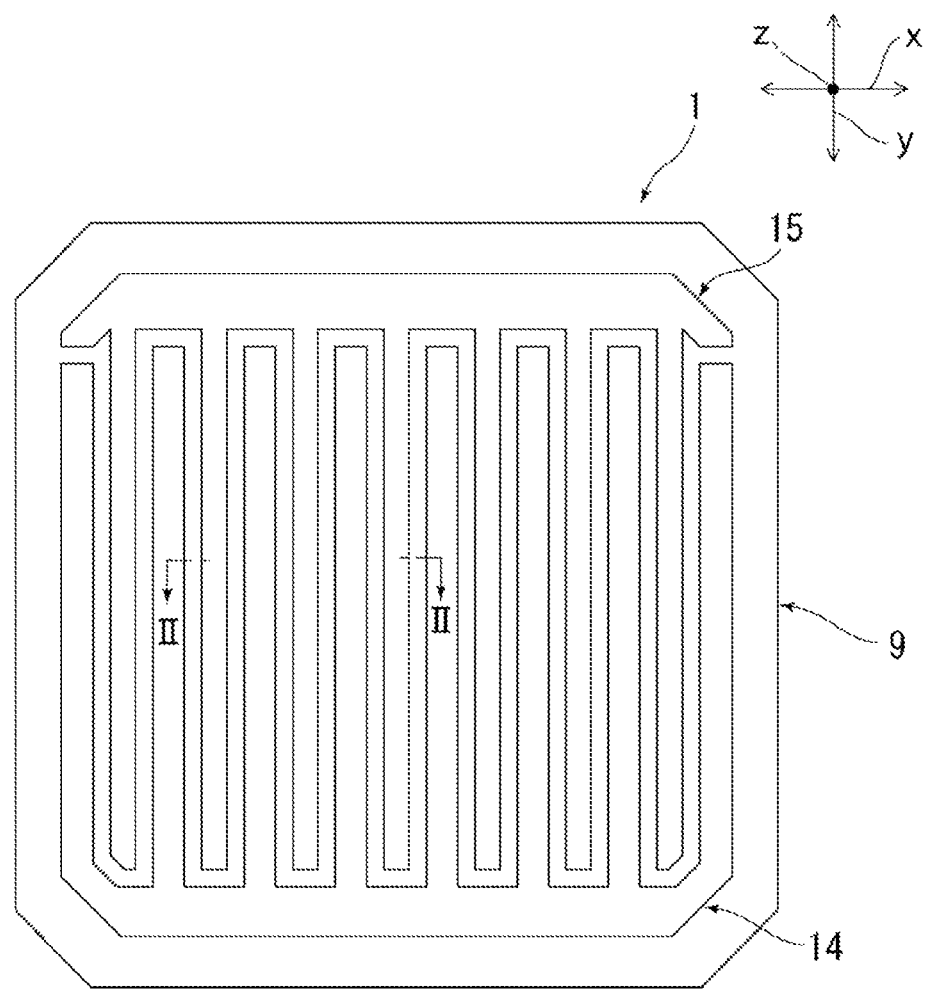
FIG. 1 is a schematic plan view of the solar cell in a first embodiment of the present invention.

The following is an explanation of examples of preferred embodiments of the present invention. The following embodiments are merely examples. The present invention is not limited to the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment

Configuration of Solar Cell 1

Figure 2:
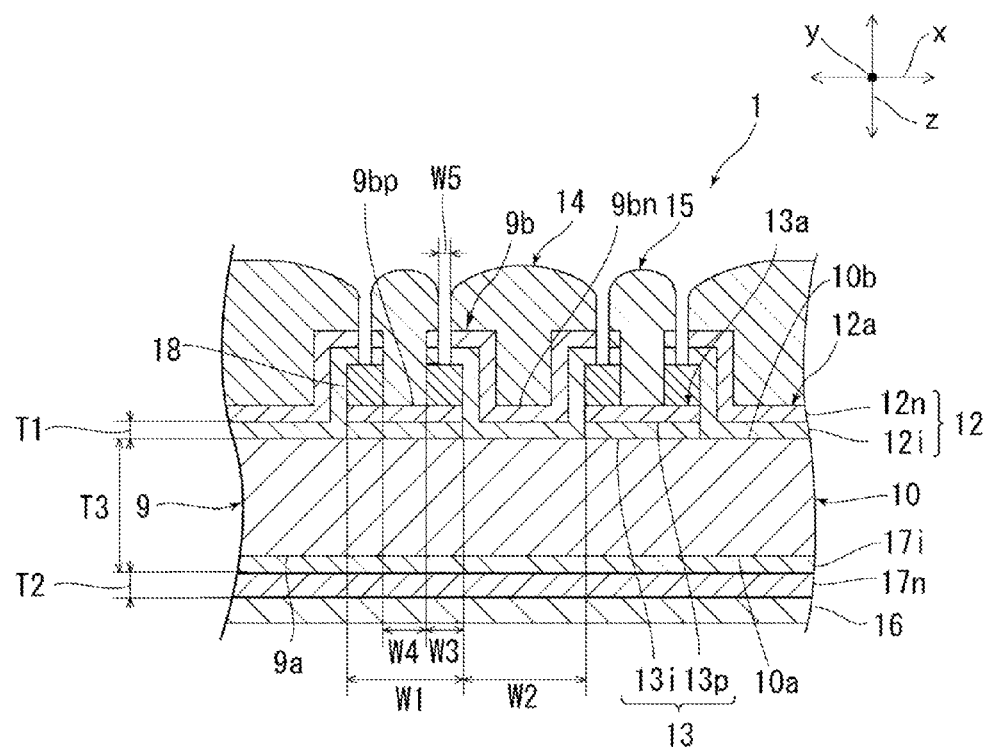
FIG. 2 is a schematic cross-sectional view from line II-II in FIG. 1.
Figure 3:
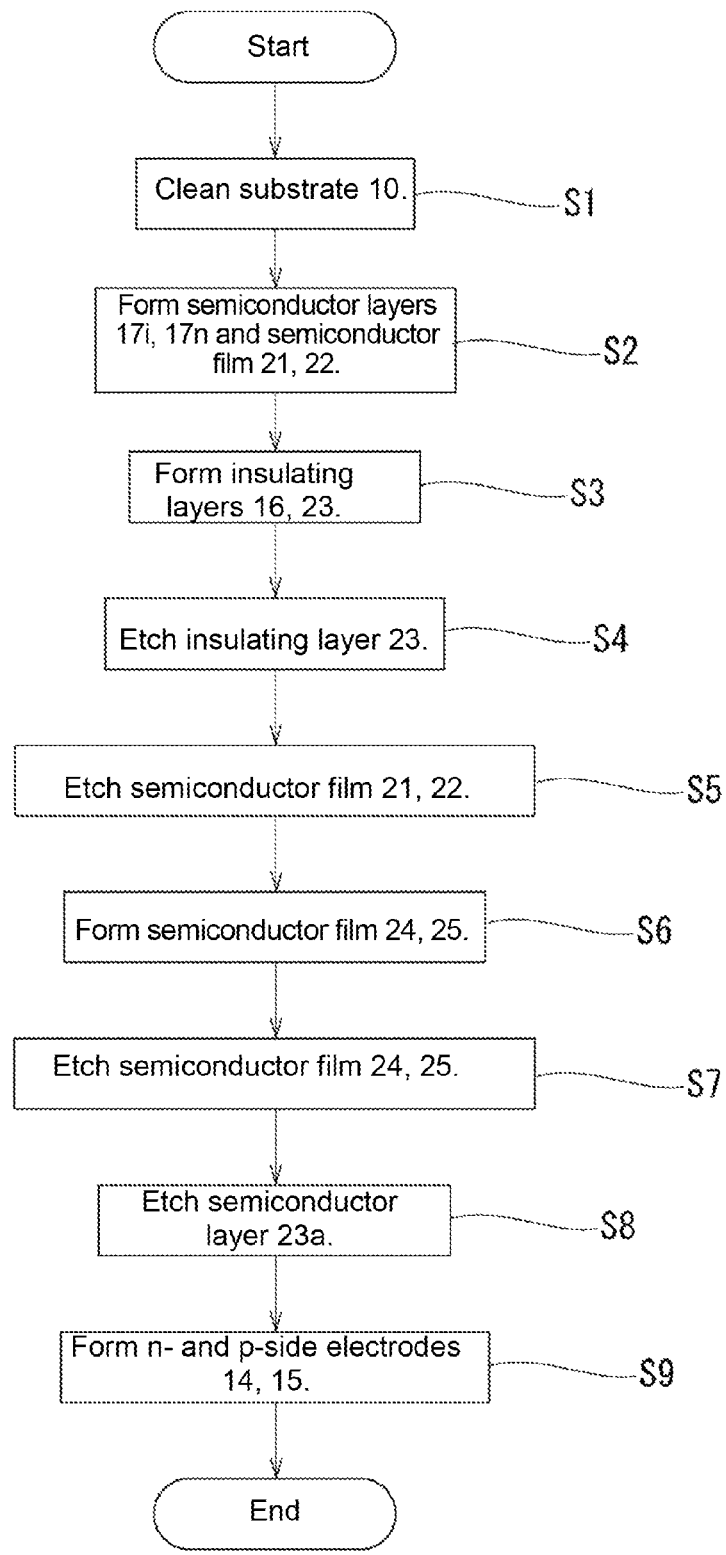
FIG. 3 is a flowchart showing the manufacturing steps for the solar cell in the first embodiment.

FIG. 1 is a schematic plan view of the solar cell in a first embodiment of the present invention. FIG. 2 is a schematic cross-sectional view from line II-II in FIG. 1.

The solar cell 1 is a back contact solar cell. When a solar cell 1 in the present embodiment does not yield sufficiently high output, the solar cell 1 is used as part of a solar cell module in which a plurality of solar cells 1 are connected by means of wiring material.

The solar cell 1 is provided with a solar cell substrate 9. The solar cell substrate 9 has a semiconductor substrate 10. The semiconductor substrate 10 has one type of conductivity. In other words, the semiconductor substrate 10 has either n-type or p-type conductivity. More specifically, in the present embodiment, the semiconductor substrate 10 is composed of an n-type crystalline silicon substrate.

The semiconductor substrate 10 has a first main surface 10a and a second main surface 10b. Semiconductor layer 12 and semiconductor layer 13 are arranged on a portion of the second main surface 10b.

Semiconductor layer 12 has an n-type semiconductor layer 12n having the same type of conductivity as the semiconductor substrate 10, and an i-type semiconductor layer 12i. The n-type semiconductor layer 12n is a semiconductor layer containing an n-type dopant. For example, the n-type semiconductor layer 12n can be made of an amorphous silicon containing an n-type dopant. The thickness of the n-type semiconductor layer 12n is preferably from 2 nm to 20 nm, and more preferably from 3 nm to 10 nm.

An i-type semiconductor layer 12i is arranged between the n-type semiconductor layer 12n and the second main surface 10b. The i-type semiconductor layer 12i can be made from i-type amorphous silicon. The i-type semiconductor layer 12i can be of any thickness as long as the thickness keeps it from contributing substantially to power generation. The thickness of the i-type semiconductor layer 12i can be from several Å to 250 Å.

Semiconductor layer 13 has a p-type semiconductor layer 13p, which has a type of conductivity different from that of semiconductor substrate 10, and an i-type semiconductor layer 13i. The p-type semiconductor layer 13p is a semiconductor layer containing a p-type dopant. The p-type semiconductor layer 13p can also be made of amorphous silicon containing a p-type dopant. The thickness of the p-type semiconductor layer 13p is preferably from 2 nm to 20 nm, and more preferably from 3 nm to 20 nm.

The i-type semiconductor layer 13i is arranged between the p-type semiconductor layer 13p and the second main surface 10b. The i-type semiconductor layer 13i can be made from i-type amorphous silicon. The i-type semiconductor layer 13i can be of any thickness as long as the thickness keeps it from contributing substantially to power generation. The thickness of the i-type semiconductor layer 13i can be from several Å to 250 Å.

Preferably, each of semiconductor layers 12i, 12n, 13i and 13p contains hydrogen. In this case, the bandgap of the semiconductor layers 12i, 12n, 13i and 13p is increased. In this way, the rebonding of carriers in the portion beneath the semiconductor layers 12i, 12n, 13i and 13p of the semiconductor substrate 10 can be more effectively suppressed.

In the present invention, an "n-type semiconductor layer" is a semiconductor layer having an n-type dopant content equal to or greater than $5 \times 10^{19}$ cm$^{-3}$.

A "p-type semiconductor layer" is a semiconductor layer having a p-type dopant content equal to or greater than $5 \times 10^{19}$ cm$^{-3}$.

An "i-type semiconductor layer" is a semiconductor layer having a dopant content less than $1 \times 10^{19}$ cm$^{-3}$.

Both semiconductor layer 12 and semiconductor layer 13 have a plurality of linear portions 12a, 13a, respectively, extending in one direction (the y direction). The linear portions 12a, 13a are arranged alternately in the direction (the x direction) perpendicular to the one direction. The linear portions 12a and 13a adjacent to each other in the x direction come into contact with each other. In other words, in the present embodiment, the entire second main surface 10b is substantially covered by semiconductor layers 12 and 13. Both the width W1 (see FIG. 2) of the linear portions 13a of semiconductor layer 13 and the width W2 of the linear portions 12a of semiconductor layer 12 are preferably from 50 μm to 2000 μm, and more preferably from 100 μm to 1000 μm.

An insulating layer 18 is formed on both ends of each linear portion 13a in the x direction, excluding the central portion. The central portion of the linear portions 13a in the x direction remains exposed from the insulating layer 18. The end portions of the semiconductor layer 12 in the x direction and the end portions of the semiconductor layer 13 in the x direction are separated from each other by the insulating layer 18 in the z direction.

There are no particular restrictions on the width W3 of the insulating layer 18 in the x direction. It can be, for example, approximately one-third of width W1. There is no particular restriction on the interval W4 in the insulating layer 18 in the x direction. It can be, for example, approximately one-third of the width W1.

There are no particular restrictions on the materials in insulating layer 18. The insulating layer 18, for example, can be formed from a silicon oxide such as $SiO_2$, a silicon nitride such as SiN, or a silicon oxynitride such as SiON. The insulating layer 18 can also be made of a metal oxide such as titanium oxide or tantalum oxide. Among these examples, an insulating layer 18 made of silicon nitride is preferred. The insulating layer 18 also preferably contains hydrogen.

The back surface 9b of the solar cell substrate 9 includes an n-type surface 9bn composed of the surface of the n-type semiconductor layer 12n, and a p-type surface 9bp composed of the surface of the p-type semiconductor layer 13p. Meanwhile, the light-receiving surface 9a of the solar cell substrate 9 is composed of the first main surface 10a of the semiconductor substrate 10.

The first main surface 10a constituting the light-receiving surface 9a has a textured structure.

An n-type semiconductor layer 17n, which has the same conductivity as the semiconductor substrate 10, is arranged on the first main surface 10a of the semiconductor substrate 10. The n-type semiconductor layer 17n is a semiconductor layer containing an n-type dopant. The n-type semiconductor layer 17n can be made of amorphous silicon containing an n-type dopant. The thickness of the n-type semiconductor layer 17n is preferably from 2 nm to 20 nm, and more preferably from 3 nm to 10 nm.

An i-type semiconductor layer 17i is arranged between the n-type semiconductor layer 17n and the first main surface 10a. The i-type semiconductor layer 17i can be made from i-type amorphous silicon. The i-type semiconductor layer 17i can be of any thickness as long as the thickness keeps it from contributing substantially to power generation. The thickness of the i-type semiconductor layer 17i can be from several Å to 250 Å.

An insulating film 16 combining the functions of an anti-reflective film and a protective film is formed on the semiconductor layer 17n. The insulating layer 16 can be formed from a silicon oxide such as $SiO_2$, a silicon nitride such as SiN, or a silicon oxynitride such as SiON. The thickness of the insulating layer 16 can be established to provide the desired anti-reflective properties for the anti-reflective film. The thickness of the insulating layer 16 can be, for example, from 80 nm to 1 μm.

An n-side electrode 14 is arranged on the semiconductor layer 12. The n-side electrode 14 is connected electrically to semiconductor layer 12. A p-side electrode 15 is arranged on semiconductor layer 13. The p-side electrode 15 is connected electrically to semiconductor layer 13. The interval W5 between electrodes 14 and 15 on the insulating layer 18 can be, for example, approximately one-third of the width W3.

In the present embodiment, both the n-side electrode 14 and the p-side electrode 15 are comb-shaped and include a busbar and a plurality of fingers. However, the n-side electrode 14 and the p-side electrode 15 may also be so-called busbarless electrodes which have no busbar but only a plurality of fingers.

The electrodes 14 and 15 can be formed from a metal such as Cu or Ag, or an alloy including at least one of these metals. The electrodes 14 and 15 can also be formed from a transparent conductive oxide (TCO) such as indium tin oxide (ITO). The electrodes 14 and 15 can also be made of a laminate having a plurality of conductive layers comprising metal, alloy or TCO layers.

In the present embodiment, the thickness T2 of n-type semiconductor layer 17n is greater than the thickness T1 of n-type semiconductor layer 12n (T2>T1). Thus, the configuration of n-type semiconductor layer 12n and n-type semiconductor layer 17n is such that the strength of the electric field formed by n-type semiconductor layer 17n is greater than the strength of the electric field formed by n-type semiconductor layer 12n.

For this reason, n-type semiconductor layer 17n is thicker and can more effectively suppress the rebonding of minority carriers (holes) in the portion of the semiconductor substrate 10 on the side with the light-receiving surface 9a (the side with the first main surface 10a) which generates most of the carriers. In addition, this can efficiently guide the minority carriers generated in the portion of the semiconductor substrate 10 on the side with the light-receiving surface 9a (the side with the first main surface 10a) towards the p-side electrode 15. This can improve the minority carrier collection efficiency.

Because the n-type semiconductor layer 12n interposed between the semiconductor substrate 10 and the n-side electrode 14 is thin, the electrical resistance between the semiconductor substrate 10 and the n-side electrode 14 is low.

Thus, in the present invention, minority carriers are less likely to rebond, the minority carriers are efficiently collected, and the electrical resistance between the semiconductor substrate 10 and the n-side electrode 14 is low. Therefore, improved photoelectric conversion efficiency can be realized.

From the perspective of obtaining even better photoelectric conversion efficiency, the thickness T2 of the n-type semiconductor layer 17n is preferably at least 1.5 times greater, and more preferably at least 2 times greater, than the thickness T1 of the n-type semiconductor layer 12n. However, when the difference between the thickness T2 of n-type semiconductor layer 17n and the thickness T1 of n-type semiconductor layer 12n is too great, the n-type semiconductor layer 12n becomes too thin, and the minority carriers tend to disappear due to rebonding with the semiconductor substrate 10 beneath n-type semiconductor layer 12n. Also, the time required to form n-type semiconductor layer 17n becomes too long. Therefore, the thickness T2 of n-type semiconductor layer 17n is preferably no more than 10 times, and more preferably no more than 5 times, the thickness T1 of n-type semiconductor layer 12n.

In the present embodiment, the hydrogen content of n-type semiconductor layer 12n is lower than the hydrogen content of n-type semiconductor layer 17n. In other words, the hydrogen content of n-type semiconductor layer 12n is low, and the hydrogen content of n-type semiconductor layer 17n is high. This can suppress rebonding of the minority carriers in the portion of the semiconductor substrate 10 on the side with the light-receiving surface 9a (the side with the first main surface 10a), and further reduce the electrical resistance between the semiconductor substrate 10 and the n-side electrode 14. Therefore, even better photoelectric conversion efficiency can be obtained.

Also, i-type semiconductor layer 12i is thinner than i-type semiconductor layer 17i. In other words, i-type semiconductor layer 12i is thin, and i-type semiconductor layer 17i is thick. This can suppress rebonding of the minority carriers in the portion of the semiconductor substrate 10 on the side with the light-receiving surface 9a (the side with the first main surface 10a), and further reduce the electrical resistance between the semiconductor substrate 10 and the n-side electrode 14. Therefore, even better photoelectric conversion efficiency can be obtained.

From the perspective of obtaining even better photoelectric conversion efficiency, i-type semiconductor layer 12i should be preferably no more than ¾, and more preferably no more than ⅔, the thickness of i-type semiconductor layer 17i. When i-type semiconductor layer 12i is too thin, the carriers tend to disappear due to rebonding. Therefore, the thickness of i-type semiconductor layer 12i should be preferably no less than ¼, and more preferably no less than ⅓, the thickness of i-type semiconductor layer 17i.

In the present invention, the width W2 of n-type semiconductor layer 12n (the width of the linear portion 12a) is smaller than the width W1 of the p-type semiconductor layer 13p (the width of the linear portion 13a). As a result, the minority carriers generated in the portion of the semiconductor substrate 10 beneath the thin n-type semiconductor layer 12n only have to move a short distance before being collected by the p-side electrode 15. This can more effectively suppress the disappearance of minority carriers due to rebonding. Therefore, even better photoelectric conversion efficiency can be realized.

From the perspective of obtaining even better photoelectric conversion efficiency, the width W2 of n-type semiconductor layer 12n should be preferably no more than 0.7 times, and more preferably no more than 0.6 times, the width W1 of p-type semiconductor layer 13p. However, when the width W2 of n-type semiconductor layer 12n becomes too small, there are cases in which the electrode area on the n-side becomes smaller, the electrical resistance increases, and the conversion efficiency is reduced. Therefore the width W2 of n-type semiconductor layer 12n should be preferably no more than 0.2 times, and more preferably no more than 0.4 times, the width W1 of p-type semiconductor layer 13p.

The width W2 of n-type semiconductor layer 12n (the width of the linear portions 12a) is smaller than twice the thickness T3 of the semiconductor substrate 10. In other words, n-type semiconductor layer 12n is configured so W2/2 is less than T3. This can more effectively suppress the disappearance of the minority carriers due to rebonding. Therefore, even better photoelectric conversion efficiency can be realized.

From the perspective of obtaining even better photoelectric conversion efficiency, W2/2 should be preferably no more than 0.8 times, and more preferably no more than 0.7 times, T3. However, when W2 becomes too small, the electrode area on the n-type side becomes smaller, the electrical resistance increases, and the conversion efficiency is reduced. Therefore, W2/2 should be preferably no more than 0.2 times, and more preferably no more than 0.4 times, T3.

The following is an explanation of the manufacturing method for the solar cell 1 in the present embodiment with reference primarily to FIG. 3 through FIG. 10.

First, the semiconductor substrate 10 is prepared. Next, in Step S1, the first main surface 10a and the second main surface 10b of the semiconductor substrate 10 are cleaned. The semiconductor substrate 10 can be cleaned using an aqueous HF solution.

Figure 4:
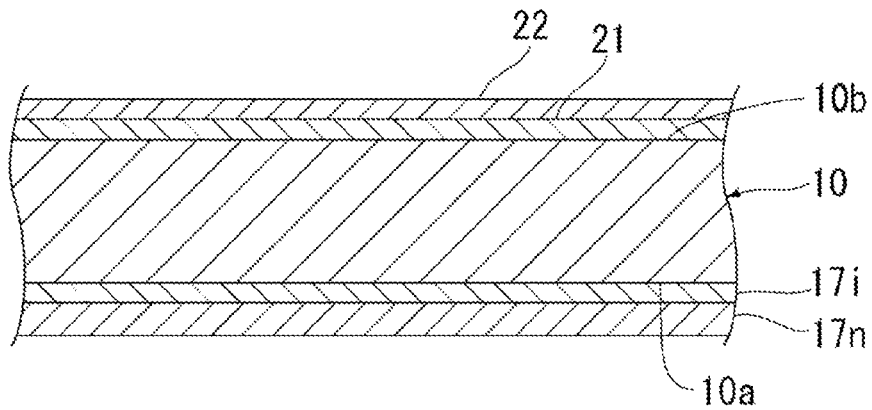
FIG. 4 is a schematic cross-sectional view used to explain a manufacturing step for the solar cell in the first embodiment.

Next, in Step S2, semiconductor layer 17i and semiconductor layer 17n are formed on the first main surface 10a of the semiconductor substrate 10, and i-type amorphous semiconductor film 21 and p-type amorphous semiconductor film 22 are formed on the second main surface 10b. (FIG. 4)

There are no restrictions on the method used to form semiconductor layers 17i and 17n and semiconductor film 21 and 22. Semiconductor layers 17i and 17n and semiconductor films 21 and 22 can be formed using a chemical vapor deposition (CVD) method such as a plasma CVD method, or another thin-film forming method such as a sputtering method.

Figure 5:
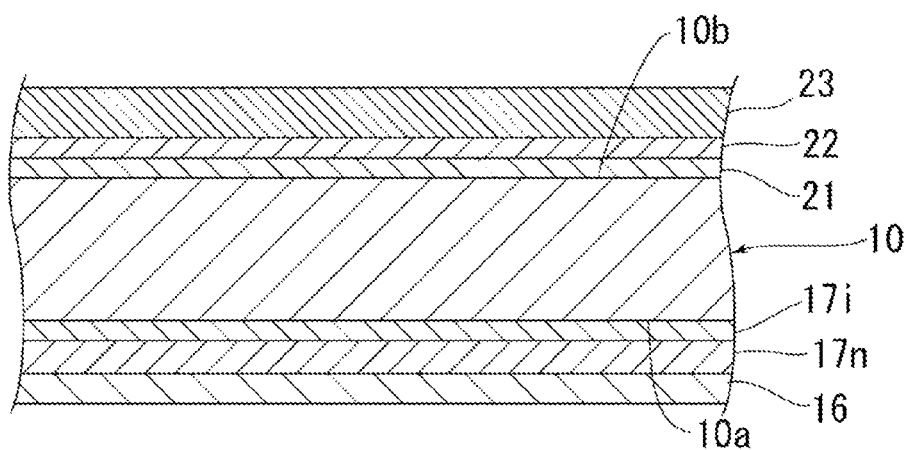
FIG. 5 is a schematic cross-sectional view used to explain a manufacturing step for the solar cell in the first embodiment.

Next, in Step S3, an insulating layer 16 is formed on the semiconductor layer 17n, and an insulating layer 23 is formed on the semiconductor film 22. There are no restrictions on the method used to form the insulating layers 16 and 23. The insulating layers 16 and 23 can be formed using a thin-film forming method such as a sputtering method or a CVD method (FIG. 5).

Figure 6:
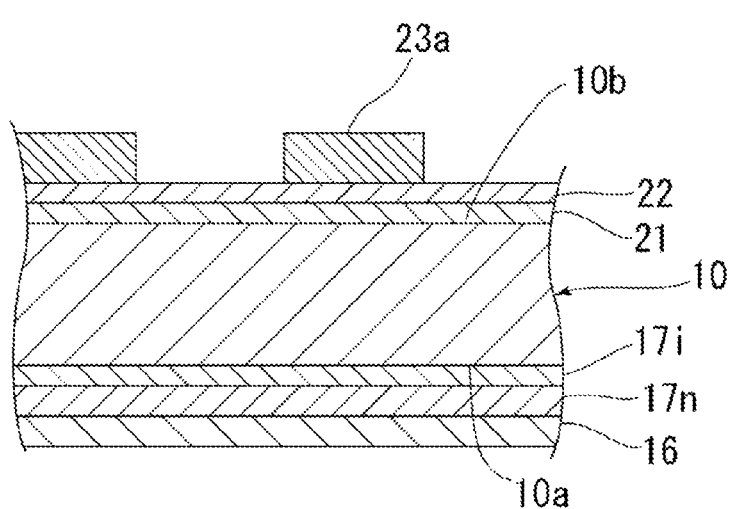
FIG. 6 is a schematic cross-sectional view used to explain a manufacturing step for the solar cell in the first embodiment.

Next, in Step S4, a portion of insulating layer 23 is removed by etching the insulating layer 23. More specifically, the portion of the insulating layer 23 above the region where the n-type semiconductor layer is bonded to the semiconductor substrate 10 in a later step is removed. In this way, insulating layer 23a is formed. When the insulating layer 23 comprises silicon oxide, silicon nitride or silicon oxynitride, the insulating layer 23 can be etched using an acidic etching solution such as an aqueous HF solution (FIG. 6).

Figure 7:
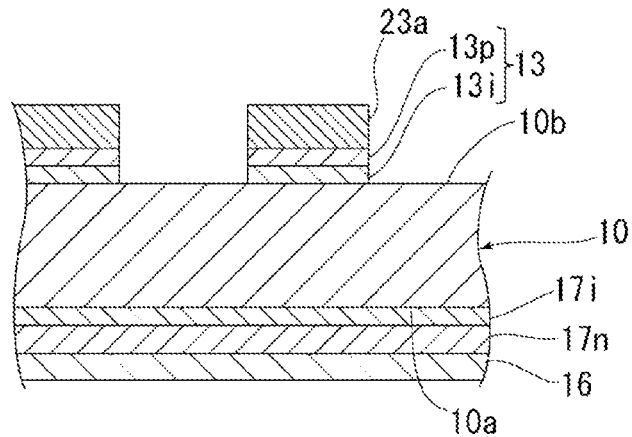
FIG. 7 is a schematic cross-sectional view used to explain a manufacturing step for the solar cell in the first embodiment.

Next, in Step S5, the insulating layer 23a is used as a mask, and semiconductor film 21 and semiconductor film 22 are etched using an acrylic etching solution to remove all portions of semiconductor film 21 and semiconductor film 22 not covered by the insulating layer 23a. In this way, the portion of the second main surface 10b not covered by the insulating layer 23a is exposed, and semiconductor layers 13i and 13p are formed from semiconductor film 21 and 22 (FIG. 7).

Figure 8:
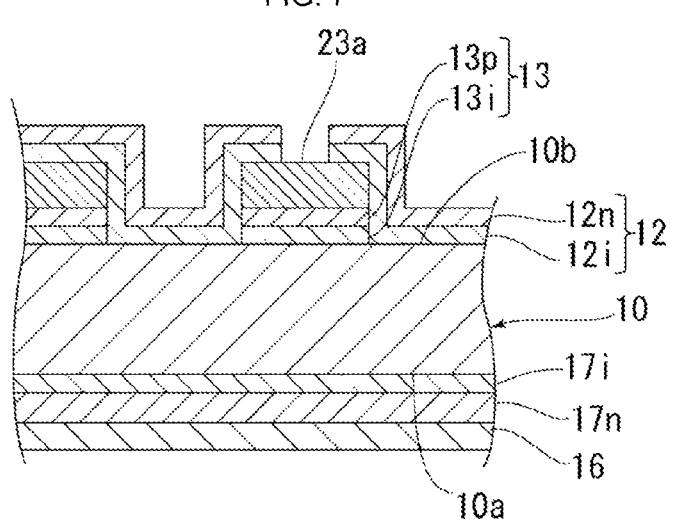
FIG. 8 is a schematic cross-sectional view used to explain a manufacturing step for the solar cell in the first embodiment.

Next, in Step S6, i-type amorphous semiconductor film 24 and n-type amorphous semiconductor film 25 are formed in successive order to cover the second main surface 10b, including the p-type semiconductor layer 13p. There are no restrictions on the method used to form amorphous semiconductor film 24 and 25. Amorphous semiconductor film 24 and 25 can be formed using a thin-film forming method such as a sputtering method or a CVD method (FIG. 8).

Figure 9:
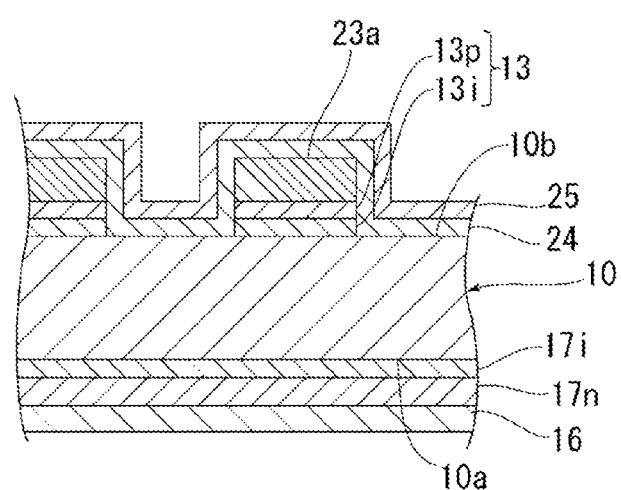
FIG. 9 is a schematic cross-sectional view used to explain a manufacturing step for the solar cell in the first embodiment.

Next, in Step S7, some of semiconductor film 24 and 25 positioned on the insulating layer 23a is etched. In this way, semiconductor layers 12i and 12n are formed from amorphous semiconductor film 24 and 25. Semiconductor film 24 and 25 can be etched using an aqueous NaOH solution (FIG. 9).

Figure 10:
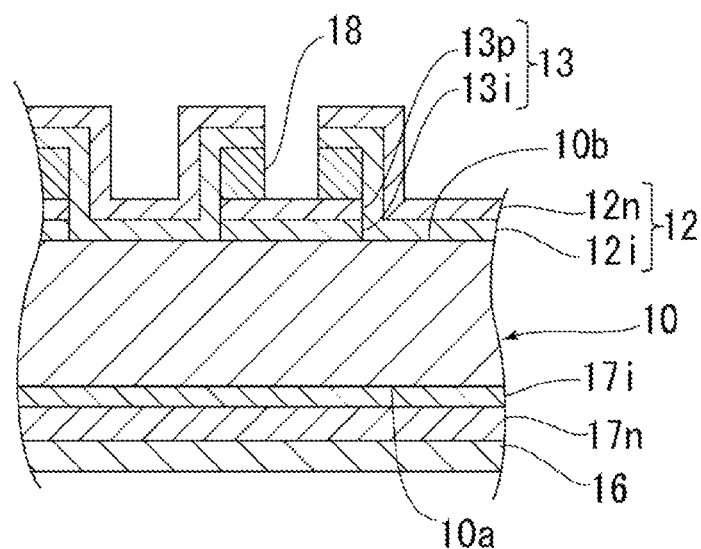
FIG. 10 is a schematic cross-sectional view used to explain a manufacturing step for the solar cell in the first embodiment.

Next, in Step S8, the insulating layer 23a is etched. More specifically, the exposed portion of the insulating layer 23a is removed by etching from the top of semiconductor layers 12i and 12n. This exposes the semiconductor layer 13p and forms insulating layer 18 from insulating layer 23a. Insulating layer 23a can be etched using an aqueous HF solution (FIG. 10).

Next, in Step S9, the solar cell 1 is completed by forming the electrodes 14 and 15 on semiconductor layer 12n and semiconductor layer 13p, respectively (FIG. 2).

In the present embodiment, the n-type semiconductor layer 12n is formed before the p-type semiconductor layer 13p.

The following is an explanation of another preferred embodiment of the present invention. In the following explanation, components having the same function as those in the first embodiment are denoted by the same reference numbers and further explanation of these components has been omitted.

2nd Embodiment

Figure 11:
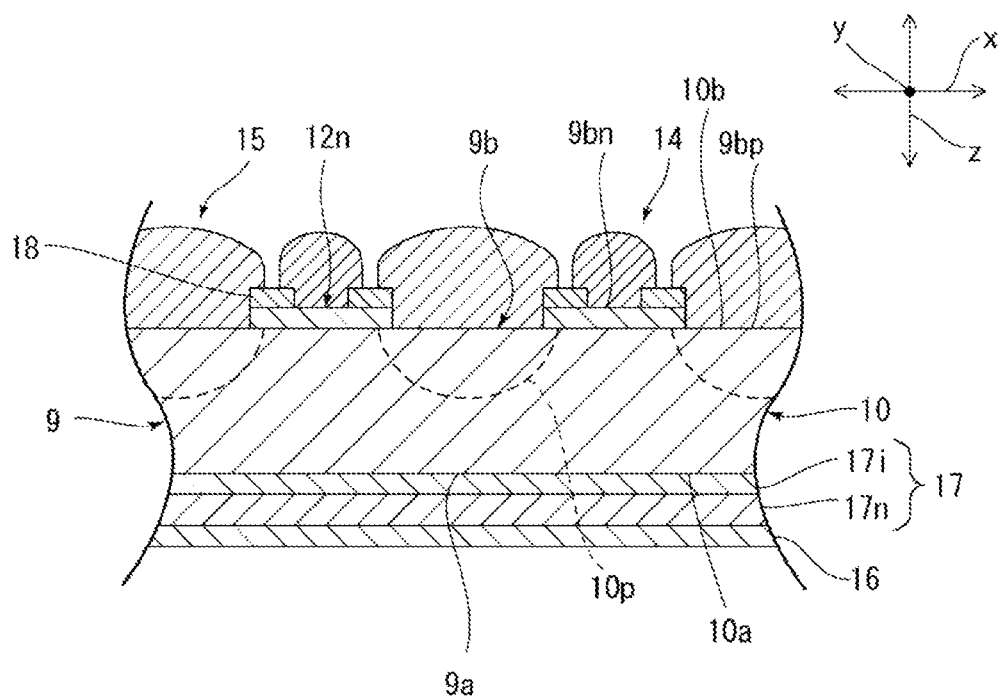
FIG. 11 is a schematic plan view of a solar cell in a second embodiment of the present invention.

FIG. 11 is a schematic plan view of a solar cell in a second embodiment of the present invention.

In the aforementioned explanation of the first embodiment, both the n-type surface 9bn and the p-type surface 9bp were both composed of a surface of the semiconductor layer. However, the present invention is not limited to this configuration.

In the solar cell of the present embodiment, the solar cell substrate 9 is composed of the semiconductor substrate 10 and the n-type semiconductor layer 12n. A p-type dopant diffusion region 10p in which a p-type dopant has been diffused is provided in the semiconductor substrate 10. The p-type surface 9bp on the back surface 9b is composed of this p-type dopant diffusion region 10p.

The present invention includes many other embodiments not described herein. For example, the strength of the electric field formed by the second semiconductor layer may be made greater than the strength of the electric field formed by the first semiconductor layer by making the dopant content of the second semiconductor layer (the n-type semiconductor layer 17n in the first embodiment) greater than the dopant content of the first semiconductor layer (the n-type semiconductor layer 12n in the first embodiment). In this case, improved photoelectric conversion efficiency similar to that in the first embodiment can be obtained. In this case, the dopant content of the second semiconductor layer is preferably from 1.5 to 10 times, and more preferably from 2 to 5 times, the dopant content of the first semiconductor layer.

Also, the second semiconductor layer may be thicker than the first semiconductor layer, and the dopant content of the second semiconductor layer may be greater than the dopant content of the first semiconductor layer.

Also, the semiconductor substrate may be a p-type semiconductor substrate.

The present invention includes many other embodiments not described herein. Therefore, the technical scope of the present invention is defined solely by the items of the invention specified in the claims pertinent to the above explanation.

KEY TO THE DRAWINGS

1: solar cell
9: solar cell substrate
9a: light-receiving surface
9b: back surface
9bn: n-type surface
9bp: p-type surface
10: semiconductor substrate
12a, 13a: linear portions
12i, 13i, 17i: i-type semiconductor layer
12n, 17n: n-type semiconductor layer
13p: p-type semiconductor layer
14: n-side electrode
15: p-side electrode
23: insulating layer
23a: insulating layer
25: n-type amorphous semiconductor film

What is claimed is:

1. A solar cell comprising:
a substrate comprising a semiconductor material having a first n or p type of conductivity;
a first semiconductor layer having the first n or p type of conductivity comprising linear portions of defined widths, lengths and thicknesses arranged on a back surface side of the substrate and having a u-shaped cross section;
a second semiconductor layer having the a first n or p of conductivity arranged on a light receiving surface side of the substrate; and
a third semiconductor layer having a second n or p type of conductivity opposite the first n or p type of conductivity and the conductivity of the substrate semiconductor material of the substrate, the third semiconductor layer comprising linear portions of defined widths, lengths and thicknesses arranged on the back surface side of the substrate, the first semiconductor layer further comprising an overlap region that overlaps the third semiconductor layer;
a first i-type semiconductor layer arranged between the first semiconductor layer and the substrate;
a second i-type semiconductor layer arranged between the second semiconductor layer and the substrate, the thickness of the second i-type semiconductor layer being from several Å to 250 Å;
a third i-type semiconductor layer arranged between the third semiconductor layer and the substrate;
an insulating layer arranged between the first semiconductor layer in the overlap region and the third Hype semiconductor layer;
a first electrode arranged on the first semiconductor layer; and
a second electrode arranged on the third semiconductor layer,
wherein the thickness of the first i-type semiconductor layer is more than one-third but less than the thickness of the second i-type semiconductor layer, and the strength of the electric field formed by the second semiconductor layer is greater than the strength of the electric field formed by the first semiconductor layer,
wherein the concentration of dopant in the second semiconductor layer is greater than the concentration of dopant in the first semiconductor layer,
wherein the first electrode and the second electrode are separated via an interval which is arranged above the insulating layer, and
wherein the interval completely penetrates the first semiconductor layer and the first i-type semiconductor layer in the overlap region.

2. The solar cell according to claim 1, wherein the thickness of the second semiconductor layer is greater than the thickness of the first semiconductor layer.

3. The solar cell according to claim 1,
wherein the width of the linear portions of the first semiconductor layer is no more than 0.7 times the width of the linear portions of the third semiconductor layer.

4. The solar cell according to claim 1,
wherein the defined widths of the linear portions of the first semiconductor layer are less than twice the thickness of the substrate.

5. The solar cell according to claim 1, wherein at least one of the first and second semiconductor layers contains hydrogen;
the content of hydrogen in the first semiconductor layer being less than the content of hydrogen in the second semiconductor layer.

6. The solar cell according to claim 3, wherein the width of the linear portions of the first semiconductor layer is no more than 0.6 times the width of the linear portions of the third semiconductor layer.

7. The solar cell according to claim 1, wherein the first semiconductor layer is n-type.

8. The solar cell according to claim 3, wherein the first semiconductor layer is n-type.

9. The solar cell according to claim 4, wherein the first semiconductor layer is n-type and the width is no more than 0.4 times the thickness of the substrate.

10. The solar cell according to claim 4, wherein the first semiconductor layer is n-type and the width is no more than 0.8 times the thickness of the substrate.

11. The solar cell of claim 1, wherein:
the first semiconductor layer is arranged on a back surface side of the substrate;
the second semiconductor layer is arranged on a light receiving surface side of the main surface of the substrate;
each of the first and third semiconductor layers has a plurality of linear portions; and
wherein the width of the linear portions of the first semiconductor layer arranged on the substrate is less than the width of the linear portions of the third semiconductor layer arranged on the substrate.

12. The solar cell of claim 1, wherein the concentration of dopant in the second semiconductor layer is greater than the concentration of dopant in the first semiconductor layer.

* * * * *